US006605507B2

United States Patent
Kawata et al.

(10) Patent No.: US 6,605,507 B2
(45) Date of Patent: *Aug. 12, 2003

(54) NON-VOLATILE SEMICONDUCTOR MEMORY DEVICE AND MANUFACTURING METHOD THEREOF

(75) Inventors: Masato Kawata, Tokyo (JP); Kuniko Kikuta, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/157,072

(22) Filed: May 29, 2002

(65) Prior Publication Data

US 2002/0146884 A1 Oct. 10, 2002

Related U.S. Application Data

(62) Division of application No. 09/389,168, filed on Sep. 2, 1999, now Pat. No. 6,437,394.

(30) Foreign Application Priority Data

Sep. 4, 1998 (JP) .......................................... 10-250265

(51) Int. Cl.[7] .......................................... H01L 21/8238
(52) U.S. Cl. ...................................................... 438/257
(58) Field of Search ............................... 438/257, 275; 257/315, 316, 317, 318

(56) References Cited

U.S. PATENT DOCUMENTS 6,037,625 A * 3/2000 Matsubara et al. ......... 257/315
6,235,583 B1 * 5/2001 Kawata et al. .............. 438/257

* cited by examiner

Primary Examiner—David Nelms
Assistant Examiner—Thao P Le
(74) Attorney, Agent, or Firm—Choate, Hall & Stewart

(57) ABSTRACT

To provide a non-volatile semiconductor memory device in which the word line resistance can be decreased in resistance without being accompanied by increase in chip area, and a manufacturing method for the non-volatile semiconductor memory device. In a non-volatile semiconductor memory device having a floating gate (203 of FIG. 2) and a control gate (205 of FIG. 2), a contact groove (407 of FIG. 4a) extending in the direction of a word line (102 of FIG. 1) is provided on an interlayer insulating film (404 of FIG. 4a) formed as an upper layer of the control gate, and an electrically conductive member of, for example, tungsten, is embedded in the contact groove to establish electrical connection between the wiring metal (409 of FIG. 4d) formed as an upper layer of the interlayer insulating film and the control gate with a large contact area.

4 Claims, 3 Drawing Sheets

F I G. 4 (a)
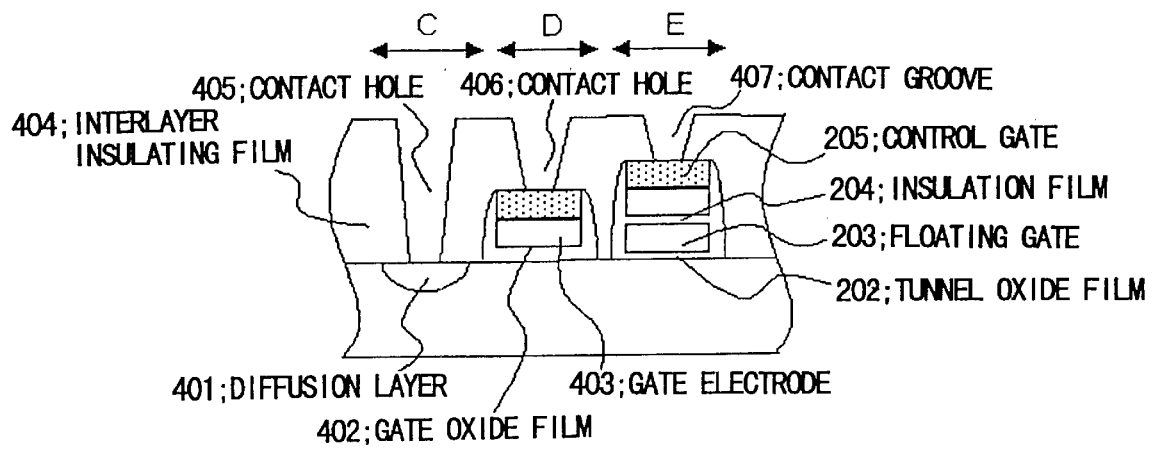
F I G. 4 (b)
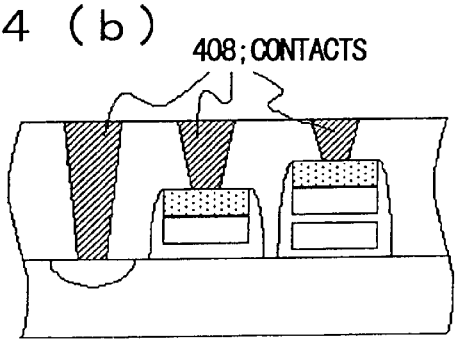
F I G. 4 (c)
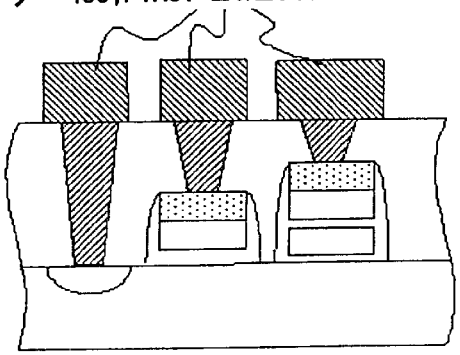

NON-VOLATILE SEMICONDUCTOR MEMORY DEVICE AND MANUFACTURING METHOD THEREOF

CROSS REFERENCE TO RELATED APPLICATIONS

This application is a divisional of U.S. patent application Ser. No. 09/389,168, filed on Sep. 2, 1999, U.S. Pat. No. 6,437,394

FIELD OF THE INVENTION

This invent ion relates to a non-volatile semiconductor memory device and a manufacturing method thereof. More particularly, it relates to a non-volatile semiconductor memory device in which a word line is subjected to lining (or backing-up) a wiring as an overlaying layer to reduce the resistance, and a manufacturing method thereof.

BACKGROUND OF THE INVENTION

Up to now, lining of a word line of a flash memory has been practiced for reducing the resistance of the word line. However, since there was not much demand for high-speed accessing and the first layer wiring, used to be frequently allocated to a bit line, it was sufficient if a word line is connected to the second and following metal wiring layers substantially at a rate of one contact per 512 or 1024 cells so as to be used as lining. However, with the increase in the need for a flash memory embedded in a micro-computer and in the demand for high-speed accessing, it has come up to be felt necessary to raise the lining frequency. FIGS. 5 to 7 show an example of connecting the word line to the metal wiring of the first layer at a rate of one contact per 16 or 32 cells.

FIG. 5 shows an array structure of a flash memory, from its upper surface, after forming a metal wiring of the first layer, and shows two wiring layers 501, 502, with the first wiring layer 501 being the first layer metal wiring serving as a wiring for lining the word line and with the second wiring 502 being a word line of the flash memory, formed of polycide. 503 denotes a contact for electrically connecting the word line 502 to the first layer metal wiring layer 501 for lining. There are provided such contacts 503 at a rate of one contact per 16 or 32 cells. 504 shows an area for a cell of the flash memory A plurality of such cell areas are provided in succession along the word line to provide a spacing for providing a contact per 16 or 32 cells.

FIG. 6 shows a cross-section along a line F–F' parallel to the word line of FIG. 5. 601 denotes an isolation oxide film, which is usually a thermal oxide film with a thickness usually as 400 nm. 602 denotes a tunnel oxide film formed by thermal oxidation and is usually of a thickness of the order of 10 nm or less. 603 denotes a floating gate and is formed of polysilicon thinly doped with phosphorus to a thickness of 150 nm. 604 is a film for electrically insulating the floating gate from the control gate. Usually, this film 604 is of a three-layered structure of oxide film/nitrided film/oxide film with a film thickness of 20 nm or less, calculated as an oxide film.

605 is a control gate having a polycide structure formed of polysilicon of an order of 150 nm doped with phosphorus and tungsten silicide of an order of 150 nm. This control gate 605 operates as a word line of the flash memory. 606 denotes a metal wiring layer used for lining the word line and which is usually of a three-layered structure of TiN/Al/TiN. 607 denotes a contact for electrically connecting the word line 605 to the metal wiring layer 606. This contact 607 usually is formed of tungsten.

FIG. 7 shows a cross-sectional view taken along line G–G' perpendicular to the word line of FIG. 5, and shows a cross-section of an area where the contact 607 is located. In FIG. 7, the reference numerals used denote the same parts or components as those shown in FIG. 6.

SUMMARY OF THE DISCLOSURE

In the course of the investigations toward the present invention, there have been encountered various problems. Namely, the conventional structure has a drawback that it is not possible to increase the read-out speed of the flash memory. The reason is that the contacts used for establishing electrical connection between the word line and the metal wiring layer used for lining are provided only at a rate of one contact for 16 or 32 cells, such that the electrical resistance of the word line cannot be lowered sufficiently. Moreover, if the rate of providing contacts is increased for lowering the resistance, it becomes necessary to provide additional space or spaces for providing the contacts thus leading to the increased memory chip area.

In view of the above-described problems of the prior art, it is a principal object of the present invention to provide a non-volatile semiconductor memory device in which the word line resistance can be lowered without being accompanied by an increased chip area, and a manufacturing method thereof.

For accomplishing the above object, according to an aspect of the present invent ion there is provided a non-volatile semiconductor memory device having a plurality of memory elements each having a floating gate and a control gate, wherein there is formed, in an inter layer insulating film formed on the control gate, a groove passed through the interlayer insulating film and extending in the direction of a word line, and wherein, by an electrically conductive member embedded in the groove, the control gate is connected to a metal wiring arranged as an overlying layer of the interlayer insulating film.

According to the present invention, the electrically conductive member embedded in the groove may be formed by the same member as the metal wiring arranged as the overlaying layer of the interlayer insulating film.

The present invention also provides a manufacturing method for a non-volatile semiconductor memory device including a plurality of peripheral circuit sections and a plurality of memory elements each having a floating gate and a control gate. The method comprises at least the steps of (a) forming an interlayer insulating film on the peripheral circuit section and as an overlying layer of the control gate of the memory element, (b) removing a pre-set area of the interlayer insulating film, providing a contact hole in the area of the peripheral circuit section and simultaneously providing a groove extending in the word line direction in a control gate area of the memory element, (c) embedding an electrically conductive member in the contact hole and in the groove, and (d) depositing a metal wiring as an overlying layer of the interlayer insulating film.

The present invention also provides a manufacturing method for a non-volatile semiconductor memory device comprising a plurality of peripheral circuit sections and a plurality of memory elements each having a floating gate and a control gate. This method comprises at least the steps of (a) forming an interlayer insulating film on the peripheral circuit section and as an overlying layer of the control gate of the memory element, (b) removing a pre-set area of the interlayer insulating film, providing a contact hole in an area of the peripheral circuit section and simultaneously providing a groove extending in the word line direction in a control gate area of the memory element, and (c) embedding an electrically conductive member within the contact hole and the groove and simultaneously forming a wiring formed by the same member as the electrically conductive member as an overlying layer of the inter layer insulating film.

BRIEF DESCRIPTION OF THE DRAWINGS

FIG. 4 is a cross-sectional view showing the manufacturing process for a flash memory array according to an embodiment of the present invention.

PREFERRED EMBODIMENTS OF THE INVENTION

Figure 5:
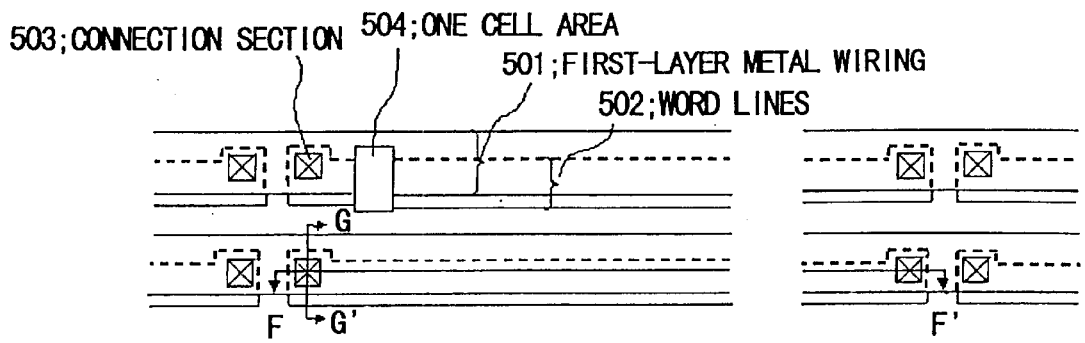
FIG. 5 shows the array structure of a conventional flash memory from an upper surface side after forming the first-layer metal wiring.
Figure 6:
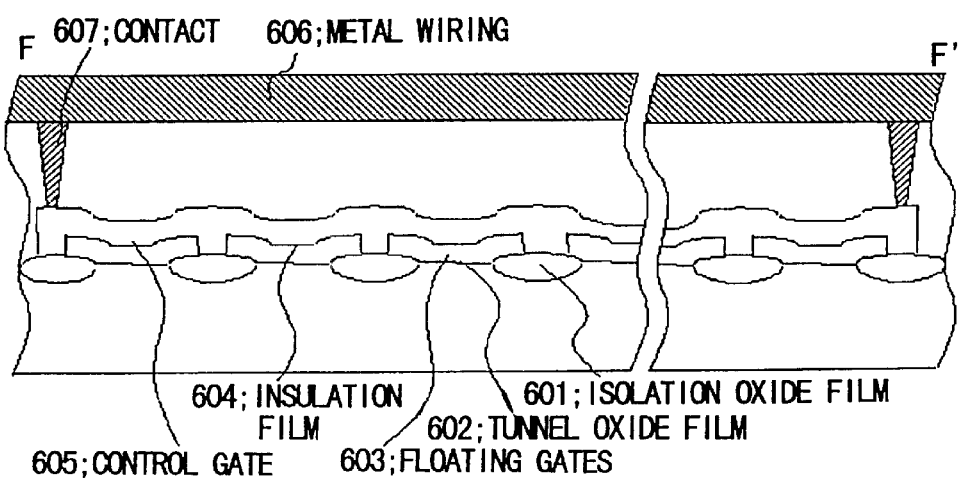
FIG. 6 is a cross-sectional view along a direction parallel to the word line of FIG. 5 (F–F' line direction).
Figure 7:
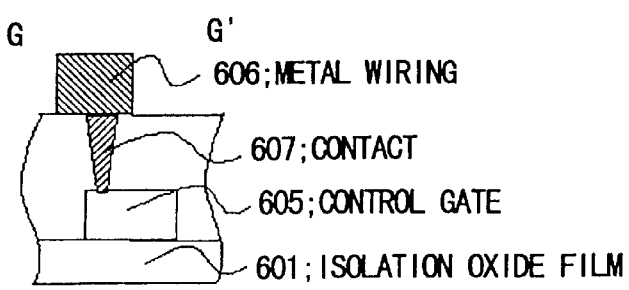
FIG. 7 is a cross-sectional view along a direction perpendicular to the word line of FIG. 5 (G–G' line direction).

In a present embodiment according to the present invention, there is provided a non-volatile semiconductor memory device having a plurality of memory elements each having a floating gate (203 of FIG. 2) and a control gate (205 of FIG. 2), wherein there is formed, in an inter layer insulating film formed on the control gate, a contact groove (408 of FIG. 5*c*) passed through the inter layer insulating film (404 of FIG. 4*a*) and extending in the direction of a word line (102 of FIG. 1), and the contact groove is buried with an electrically conductive member of, for example, tungsten, whereby the metal wiring layer (409 of FIG. 4*c*) and the control gate are electrically connected with a large contact area.

By this arrangement, it is possible to increase the contact area between the metal wiring of a low resistivity and the control gate, whereby the wiring resistance between the word lines interconnecting the control gate can be reduced to increase the read-out speed of the flash memory.

DETAILED DESCRIPTION OF THE EMBODIMENTS

Figure 1:
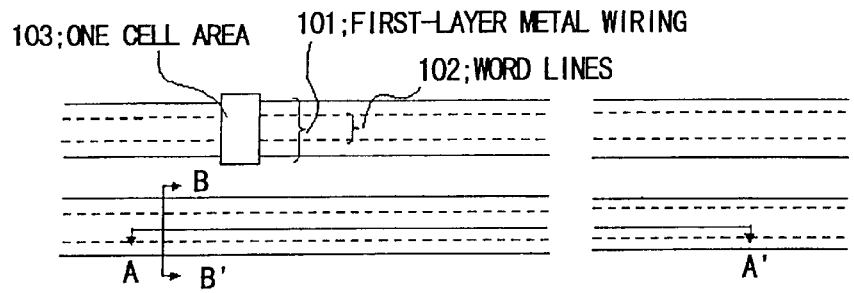
FIG. 1 shows an array structure of a flash memory according to an embodiment of the present invent ion from above, after formation of the first-layer metal wiring.
Figure 2:
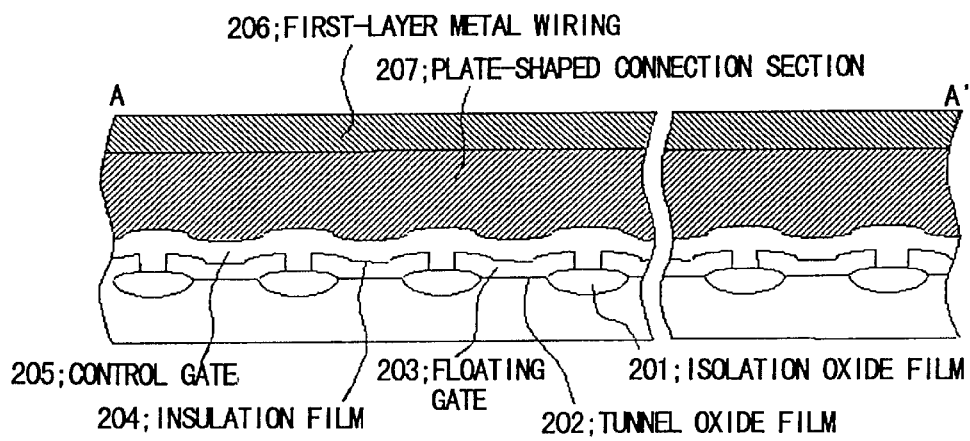
FIG. 2 is a cross-sectional view along a direction parallel to the word line (A–A' line direction).
Figure 3:
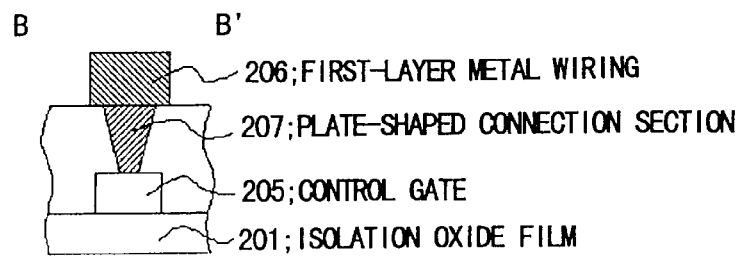
FIG. 3 is a cross-sectional view along a direction perpendicular to the word line (B–B' line direction).

For illustrating the above-described embodiments of the present invention, an embodiment of the present invention will be explained by referring to FIGS. 1 to 4. FIG. 1 shows, from an upper surface side, an array structure of the flash memory according to an embodiment of the present invention, in such a state in which there has been formed a first metal wiring layer. FIG. 2 is a cross-sectional view, taken along line A–A' in FIG. 1, and FIG. 3 is a cross-sectional view, taken along line B–B' in FIG. 1. FIG. 4 is a cross-sectional view for illustrating the manufacturing method of the flash memory according to an embodiment of the present invention.

FIG. 1 shows two wiring layers 101, 102. The wiring 101 is the first layer metal wiring which, in the present embodiment, is a wiring for lining (backing-up) a word line. The wiring 102 is a word line for the flash memory. The wiring 102 is formed of polycide. 103 denotes an area for a flash memory cell, a plurality of such cell being arranged in succession along the word line. There is no necessity of providing additional space for the contacts with the first metal wiring layer.

FIG. 2 show a cross-section along line A–A' parallel to the word line of FIG. 1. 201 denotes an isolation oxide film which is a thermal oxide film usually with a film thickness of approximately 400 nm. 202 is a tunnel oxide film formed by thermal oxidation and which is usually of a film thickness of an order of 10 nm or less. 203 is a floating gate formed of polysilicon doped with phosphorus to a thin thickness of the order of 150 nm. 204 is a film for electrically insulating the floating gate from the control gate and usually has a three-layer structure of an oxide film/nitride film/ oxide film with a film thickness of 20 nm or less calculated as an oxide film.

205 is a control gate having a polycide structure comprised of polysilicon of the order of 150 nm doped with phosphorus and tungsten silicide of the order of 150 nm. This control gate 205 operates as a word line of the flash memory. 206 is the first layer metal wiring used for lining the word line in the present embodiment. The first layer metal wiring 206 is usually of a three-layer structure of TiN/Al/TiN, as will be explained subsequently. 207 is a section interconnecting the word line 205 and the first layer metal wiring 206 in a plate-like fashion. Meanwhile, if the contact of the peripheral circuit and the first layer metal wiring 206 are to be formed simultaneously, the first layer metal wiring 206 is formed of tungsten.

FIG. 3 is a cross-sectional view along line B–B' a perpendicular to the word line of FIG. 1 for illustrating a cross-section of an area devoid of the floating gate. The reference numerals used in FIG. 3 denote parts or components similar to those shown in FIG. 2.

Referring to FIG. 4, a method for manufacturing a flash memory of the present embodiment is explained. For convenience, the following explanation is started from a state in which, after formation of flash memory cell transistors and transistors constituting a peripheral circuit, an inter-layer insulating film has been planarized by a method such as chemical/mechanical polishing (CMP). In FIG. 4*a*, an area C denotes a diffusion layer area of a cell and a peripheral circuit section, an area D denotes a transistor area of the peripheral circuit section and an area E denotes a flash memory cell transistor area. Although there is no site exactly corresponding to this configuration in the actual structure, the above areas are shown in the same drawing for convenience in illustration.

401 denotes a diffusion layer, and 402 denotes a gate oxide film of a transistor of the peripheral circuit section usually produced by thermal oxidation to a film thickness of the order of 8 nm or less. It is noted, however, that the gate oxide film of the transistor designed to withstand high voltage is 25 nm or less. 403 is a gate electrode of the transistor of the peripheral circuit section which is simultaneously generated as the control gate 205 of the flash memory cell and hence is of the same polycide structure. Meanwhile, the flash memory cell section is denoted by the same reference numeral as that used in FIG. 2.

An interlayer insulating film, such as BPSG, is deposited and subsequently planarized by, for example, CMP method, to a approximately 800 nm. Contact holes 405, 406 and a contact groove 407 then are formed by a known lithographic process and a known etching process, as shown in FIG. 4a. In this case, 407 is not a usual contact hole but is a contact groove which enables the formation of a plate-shaped connecting portion 206 shown in FIG. 2.

The next following process steps are the same as the usual wiring process. That is, barrier metal, such as Ti/TiN, is formed in the contact hole 407 by a sputtering method, and subsequently metal, such as tungsten, is buried by the CVD method. A contact 408, buried in metal, as shown in FIG. 4b, is formed by the CMP method or by an etchback method. The metal which is to be the metal wiring of the first layer, such as TiN/Al/TiN, is deposited by the sputtering method to a film thickness of, for example, 100 nm/500 nm/50 nm, to generate a first layer metal wiring 409, shown in FIG. 4c, by etching (or by masking).

Meanwhile, the materials shown in the present embodiment are not limited to those shown above. In particular, the metal embedded in the contact groove 408 is not limited to tungsten and may be the same metal as the material for burying the contact of the peripheral circuit section, such as aluminum or copper.

Thus, in the structure of the present embodiment, since the control gate 205, which is to be the word line 102, and the wiring metal 409 of the first layer generated by the interlayer insulating film 404 are electrically interconnected by a plate-shaped connecting portion 207 of an increased area, it is possible to reduce the resistance of the word line 102.

The meritorious effect of the present invention are summarized as follows.

According to the present invention described above, there is realized a meritorious effect that the flash memory readout time can be reduced.

The reason is that, in lining a word line of polycide with metal wiring, the word line can be significantly reduced in resistance by changing from point contact by conventional contacts to line contact. In particular, the present invention is effective in a flash memory embedded in a microcomputer in which high-speed access is required.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A manufacturing method for a non-volatile semiconductor memory device including a plurality of peripheral circuit sections and a plurality of memory elements each having a floating gate and a control gate, at least comprising the steps of:

(a) forming an interlayer insulating film on said peripheral circuit section and as an overlying layer of the control gate of said memory element;

(b) removing a pre-set area of said interlayer insulating film, providing a contact hole in said area of the peripheral circuit section and simultaneously providing a groove extending in the word line direction in a control gate area of said memory element;

(c) embedding an electrically conductive member in said contact hole and in said groove; and (d) depositing a metal wiring as an overlying layer of said interlayer insulating film.

2. A manufacturing method for a non-volatile semiconductor memory device including a plurality of peripheral circuit sections and a plurality of memory elements each having a floating gate and a control gate, comprising at least the steps of:

(a) forming an interlayer insulating film on said peripheral circuit section and as an overlying layer of the control gate of said memory element;

(b) removing a pre-set area of said interlayer insulating film, providing a contact hole in an area of the peripheral circuit section and simultaneously providing a groove extending in the word line direction in a control gate area of said memory element; and (c) embedding an electrically conductive member within said contact hole and said groove and simultaneously forming a wiring formed by the same member as said electrically conductive member as an over lying layer of said inter layer insulating film.

3. The manufacturing method for the non-volatile semiconductor memory device according to claim 1 wherein said electrically conductive member comprises at least tungsten and said metal wiring comprises at least aluminum or copper.

4. The manufacturing method for the non-volatile semiconductor memory device according to claim 2 wherein said electrically conductive member comprises at least tungsten, aluminum or copper.

* * * * *